United States Patent [19]

Graham et al.

[11] Patent Number: 4,484,035
[45] Date of Patent: Nov. 20, 1984

[54] DUAL TONE MULTI FREQUENCY DIGITAL DETECTOR

[75] Inventors: Martin H. Graham, Berkeley; Enoch Callaway, Tiburon, both of Calif.

[73] Assignee: Transwave, Tiburon, Calif.

[21] Appl. No.: 468,744

[22] Filed: Feb. 22, 1983

Related U.S. Application Data

[63] Continuation-in-part of Ser. No. 191,556, Sep. 29, 1980, abandoned.

[51] Int. Cl.³ .................. H04M 1/50; G01R 23/02
[52] U.S. Cl. .......................... 179/84 VF; 328/138; 364/484; 364/728
[58] Field of Search .............. 179/84 VF; 328/138; 364/484, 485, 728

[56] References Cited

U.S. PATENT DOCUMENTS 3,882,283  5/1975  Proudfoot ............... 179/84 VF
4,100,378  7/1978  Claasen et al. .......... 179/84 VF

*Primary Examiner*—Joseph A. Popek

[57] ABSTRACT

Dual tone multi frequency signals, such as those used in Touch-Tone ® telephones, are digitally detected. In an eight tone frequency regime of four low frequencies (697 hz, 770 hz, 852 hz and 941 hz) and four high frequencies (1209 hz, 1336 hz, 1477 hz and 1633 hz)) combinations of paired tones, one from each group, are detected. Each received tone is converted to a digital format and thereafter passed through parallel digital filtering in a microprocessor acting as a tone detector. Each suspect tone is examined twice, once for a short time interval in the range of 10 milliseconds and once for a long time interval in the range of 20 milliseconds. The short time span, generally not capable of resolving the discrete tones in each group one from another, only produces a broad power response to the signals present in each group thus giving a wide band filter. The long time examination is sufficient to discretely resolve each of the chosen four discrete frequencies thus giving a narrow band filter. The signal from each of the examinations, the long time interval and the short time interval, are then compared to each other. The signals are passed if the ratio of the signal strength of the long time span detected signal to the sum of the short time span detected signals of the frequency group is 8/10 or greater. Frequencies outside of the specified tones by a margin exceeding 3.5 percent cannot be passed with the prescribed ratio of 8/10 of the long time span signal to the short time signal. Provision is made to avoid dial tone interference by utilizing a digitized raised window in the order of a cosine window as a multiplier to shape the input signal.

9 Claims, 10 Drawing Figures

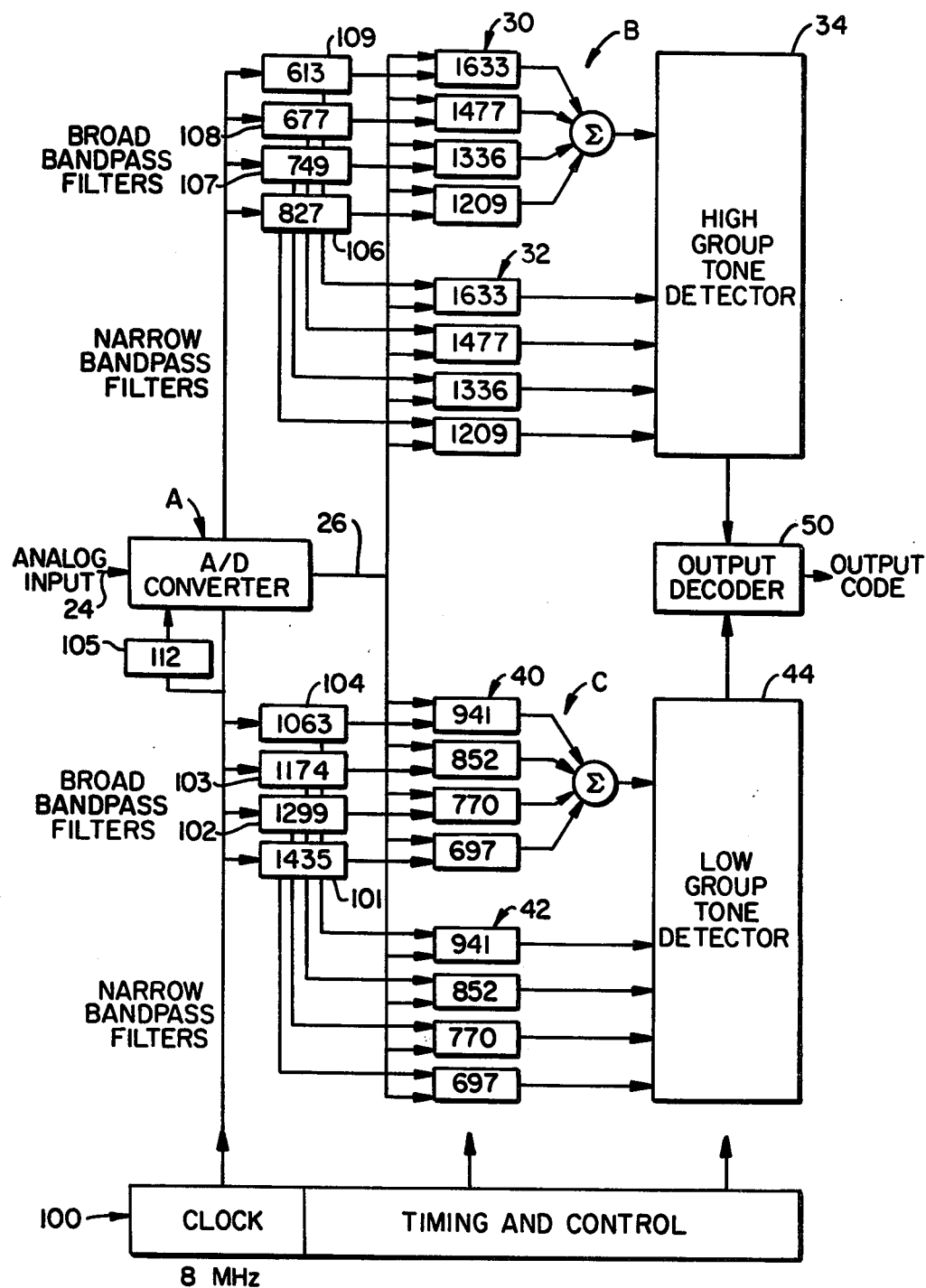
FIG._1.

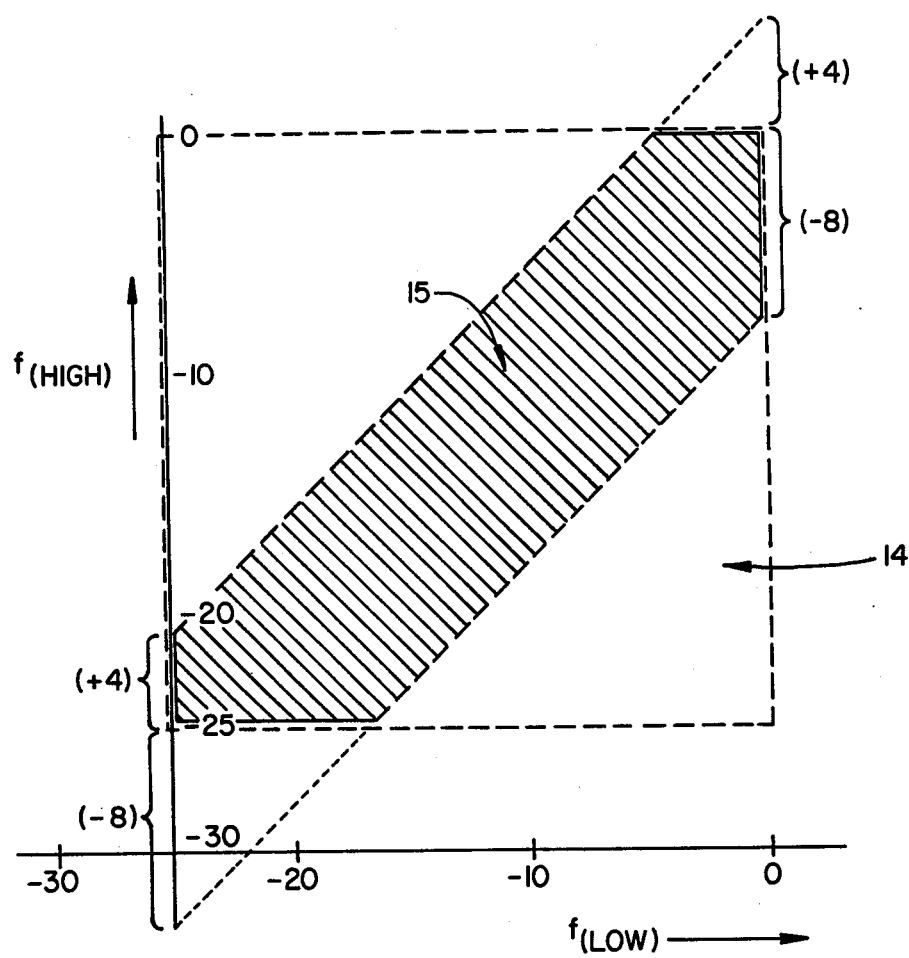
FIG._2.
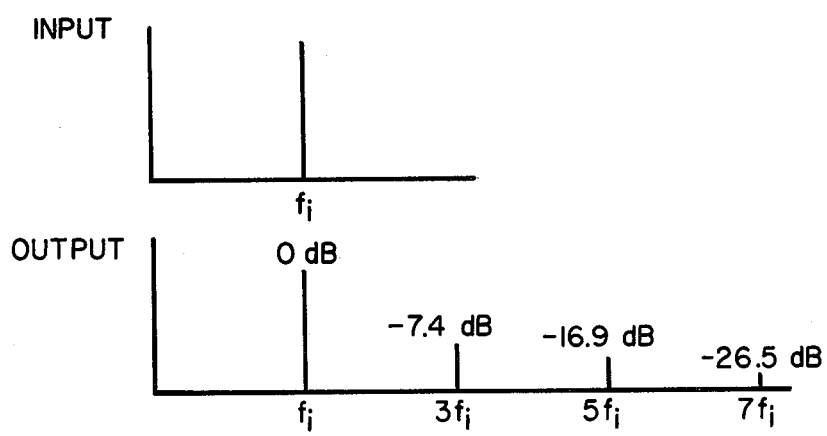
FIG._3.

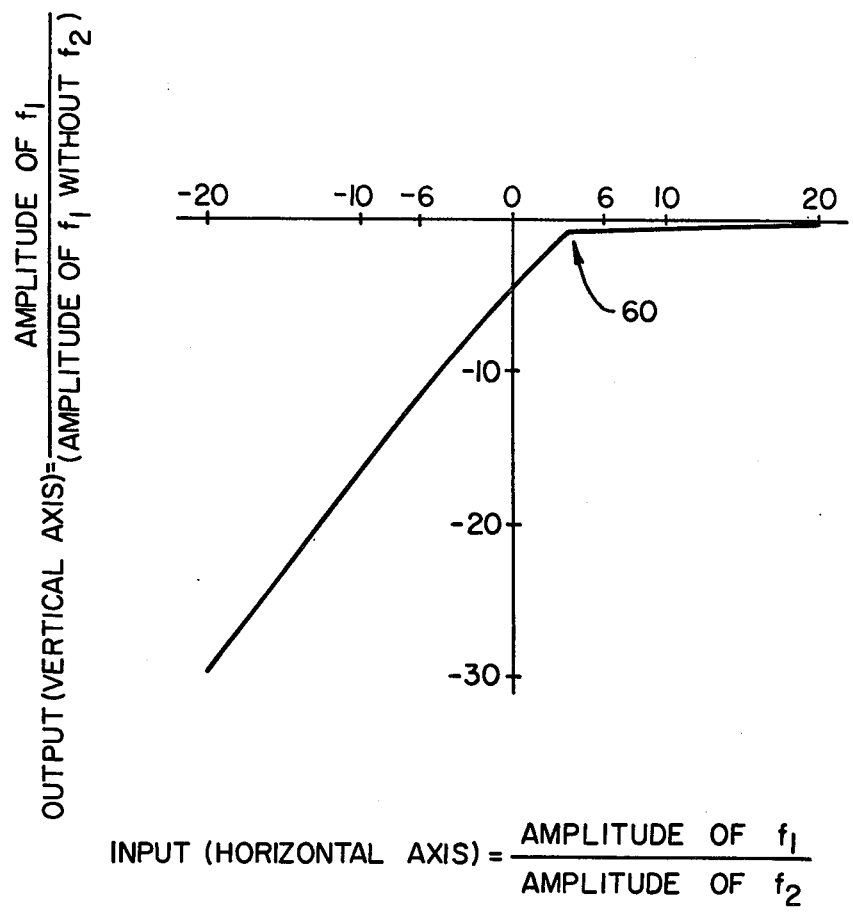
FIG._4.

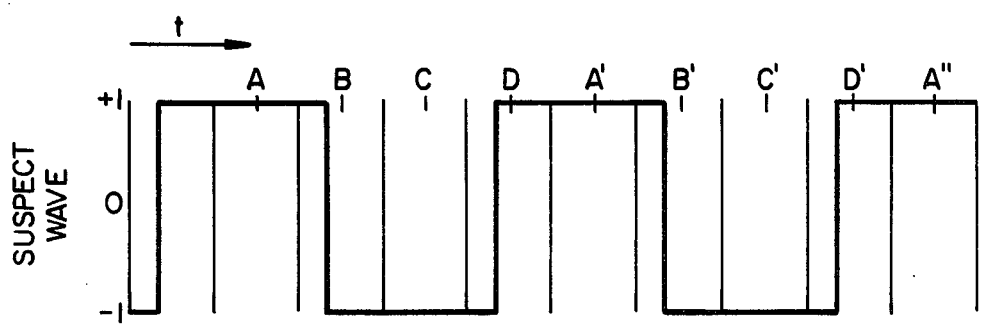
FIG._5A.
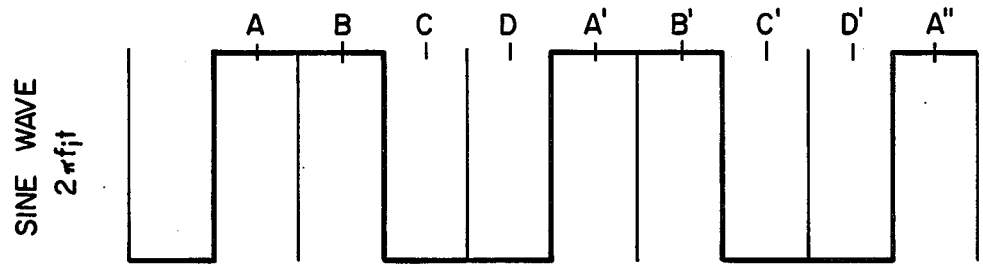
FIG._5B.
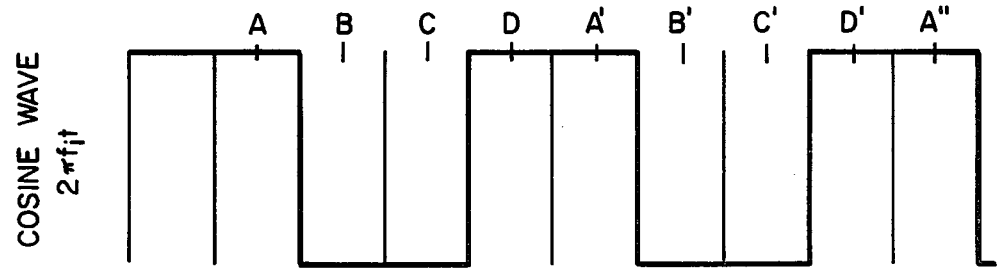
FIG._5C.

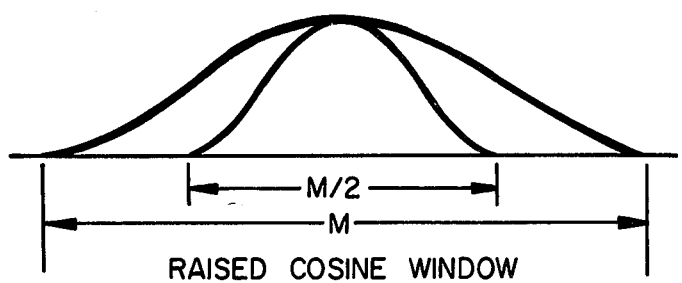
FIG._6A.
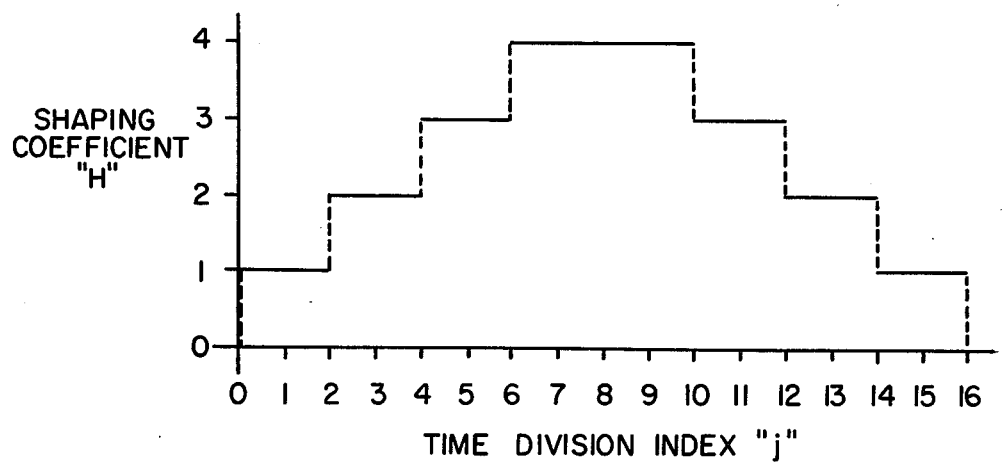
FIG._6B.
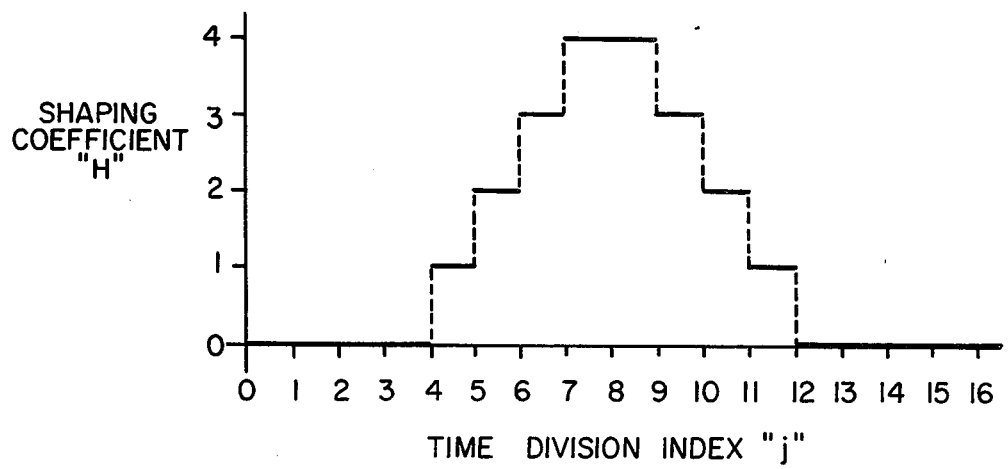
FIG._6C.

DUAL TONE MULTI FREQUENCY DIGITAL DETECTOR

This application is a continuation-in-part of co-pending patent application Ser. No. 191,556, filed Sept. 29, 1980, now abandoned.

This invention relates to dual tone multi frequency (DTMF) signaling and discloses apparatus and method for digitally filtering such signals. The apparatus is particularly adaptable to the signals commonly employed by Touch Tone ®, a registered trademark of the Bell Telephone Laboratory, telephones such as those generally in use throughout the United States in the year 1980.

SUMMARY OF THE PRIOR ART

The basic concept of DTMF signaling is that two tones are simultaneously transmitted to convey digital information. The standard is to transmit one from a "low group" of four frequencies [697 Hz, 770 Hz, 852 Hz, 941 Hz] and one from a "high group" of four frequencies [1209 Hz, 1336 Hz, 1477 Hz, 1633 Hz]. A DTMF receiver must recognize which one of the sixteen possible combinations was received.

The specifications for DTMF type I receivers (receivers in general use) are listed below. The most important of these specify (a) The receiver shall register the presence of a pair of tones if both their individual frequency components deviate less than 1.5% from nominal. The receiver shall not register if either frequency component deviates by more than 3.5% from nominal.

(b) The receiver shall register a tone if it is as short as 40 milliseconds in duration. The receiver shall register interdigital intervals as short as 40 milliseconds.

(c) The receiver shall register pairs of tones, the ratio of whose amplitudes can vary from +4 dB to −8 dB, relative to the lower frequency tone. The power per frequency can be −25 dBm to 0 dBm.

(d) The receiver shall register signal tones in the presence of dial tones whose amplitudes are up to 9 dBm greater than those of the signal tones (up to −16 dBm).

(e) The receiver shall register tones in the presence of zero to −3 kHz band-limited gaussian noise of at most −35 dBm.

The receiver function has heretofore been implemented with analog circuits to separate the response to each of the eight frequencies, followed by circuits that set thresholds, followed by circuits that convert the logical outputs of these circuits to an indication of which of the sixteen combinations was received. An alternate method is to use analog circuits to separate the low and high groups, and then process these two separate signals in a digital fashion. Digital circuitry counts zero-crossings per unit time (i.e., frequency determination) to establish which low frequency was present and which high frequency was present, and then follows the same logical treatment as in the preceding (analog) case.

FIG. 2 provides a graphical representation of the signals which can be transmitted according to the aforementioned telephone standards. Low frequencies are plotted in ascending order from −30 dB to 0 dB along the abscissa. High frequencies are plotted from −30 dB to 0 dB along the ordinate. Taking the existing dial tone standards as set forth by the Bell Telephone network, it can be seen that the power permitted per frequency is from −25 dBm to 0 dBm. This plots a square window generally designated 14.

Those familiar with the signaling arts know that where high differential amplitudes are encountered, one signal can "twist" or overcome other adjacent signals. For example, if one of the specified tones in each group is of high amplitude the resulting signals in the remaining group may be interfered with. This is especially true where transmission includes multiplexing and amplification as it inevitably does in a modern telephone network. To avoid this, a limitation on the ratio is required. Specifically, the power of the high frequency tone can vary only from +4 dB to −8 dB relative to the lower frequency tone. Geometrically, this is represented by a diagonal band that is superimposed on square window 14. This results in a shaded area 15 in which permissible signals can fall. It can be thus seen that the area of acceptable signal under the current standards is peculiar in range. The implementation of receiving networks that can meet these standards has heretofore been the subject of rather complex and expensive analog circuitry.

SUMMARY OF THE INVENTION

Dual tone multi frequency signals, such as those used in Touch Tone ® telephones, are digitally detected. In an eight tone frequency regime of four low frequencies (697 hz, 770 hz, 852 hz and 941 hz) and four high frequencies (1209 hz, 1336 hz, 1477 hz and 1633 hz)) combinations of paired tones, one from each group, are detected. Each received tone is converted to a digital format and thereafter passed through parallel digital filtering, preferably implemented in a microprocessor acting as a tone detector. Each suspect tone is examined twice, once for a short time interval in the range of 10 milliseconds and once for a long time interval in the range of 20 milliseconds. The short time span, generally not capable of resolving the discrete tones in each group one from another, only produces a broad power response to the signals present in each group, thus giving a wide band filter. The long time examination is sufficient to discretely resolve each of the chosen four discrete frequencies thus giving a narrow band filter. The signal from each of the examinations, the long time interval and the short time interval, are then compared to each other. The signals are passed if the ratio of the signal strength of the long time span detected signal to the sum of the short time span detected signals of the frequency group is 8/10 or greater. Frequencies outside of the specified tones by a margin exceeding 3.5 percent cannot be passed with the prescribed ratio of 8/10 of the long time span signal to the short time signal. Provision is made to avoid dial tone interference by utilizing a digitized raised window in the order of a cosine window as a multiplier to shape the input signal.

OBJECTS AND ADVANTAGES

An object of this invention is to disclose a digital filtering apparatus and process wherein each incoming signal is digitally filtered twice. A first and long interval digital filtering (on the order of at least 20 milliseconds) is long enough to get individual precise resolution of each of the discrete tones being sent. The second and short filter analysis is for a time interval on the order of ten milliseconds, which is not capable of individually resolving each signal of a group. The short time span resolution only resolves that a signal is broadly present, which signal is somewhere within the frequency spectrum covering an entire group. The signals from each filter analysis, the long time interval sample and the short time interval sample, are thereafter integrated and compared. Where the discretely received signal is 8/10 of the power or greater of the broadly received signal, passage occurs.

An advantage of the present invention is that it has the unexpected result of utilizing a signal which is theoretically not capable of resolving the individual signal in each group to effect an improved resolution of the signal in each group. This improved resolution is achieved by integrating and comparing the strength of both the long time span integrated signal and the short time span integrated signal. Stated in other words, by utilizing a broad band pass filter which passes any frequency that could possibly be within the group and taking a ratio of a discretely detected signal to the broad band signal, even finer resolution is achieved.

A further advantage and unexpected result of the filtering technique is that it is capable of rejecting the case wherein paired signals out of the same group of four signals are present. In this case, neither discretely received signal will have a ratio of 8/10 of the power of the broadly received or short time span sample signal. The parity hurdle provided by the ratio of the frequencies present will prevent either signal from being registered as received.

A further advantage is that the filtering herein disclosed is theoretically suitable for one bit accuracy representation of the input signal. As will hereinafter become more apparent, with the exception of the overriding dial tone signal, all the specifications can be met with a one bit analysis.

An advantage of the present invention is that a one bit converter is particularly simple to construct. Questions of scale factor and possible gain adjustment are eliminated.

Yet another advantage of the present invention is that the filter scheme readily fits into the restricted environment of the telephone Touch Tone ® system.

Yet another advantage of the present invention is that the capture effect (wherein one signal is of much greater amplitude than the other signal) can be avoided.

A further object of the present invention is to disclose the digital apparatus and process for integrating signals. According to this aspect of the invention, the sine and cosine combined magnitudes are summed by sampling the digital signal at predetermined intervals. Calculations by summing the detected signals are made. By storing the partial sums and not performing any operation when the digitized sums are of a zero power, rapid indications of magnitude are obtained with a minimum number of manipulations.

An advantage of this aspect of the invention is that the integration of the signal and hence the determination of powers are effected chiefly by summation operations within the microprocessor. The short integration process rapidly accomplishes the determination of signal power, which can thereafter give rise to a rapid comparison.

A further object of the present invention is to disclose a cosine window technique which eliminates the penetration of close harmonics to the received signals. According to this aspect of the invention, a step level function patterned after a cosine window is digitally created. Signals close to but not the same as each of the discrete signals of the two groups can be rejected as they will not clear the created edges of the cosine window.

An advantage of this aspect of the present invention is that the dial tone harmonics do not interfere with the signals processed by this filter.

Other objects, features and advantages of this invention will become more apparent after referring to the following specifications and attached drawings which.

BRIEF DESCRIPTION OF THE DRAWINGS

FIG. 1 is a block diagram of the DTMF receiver;

FIG. 2 is a graph showing the area of permissible relative signal amplitudes for use in the phone system;

FIG. 3 shows a spectral analysis of the input and output amplitude of a single frequency $f_i$ input to a comparator;

FIG. 4 is a graph of the input and output amplitudes when two frequencies are present;

FIG. 5A shows a suspect wave after it has been digitized;

FIG. 5B shows the sign of sin $(2\#f_it)$ as a function of time;

FIG. 5C shows the sign of cos $(2\#f_it)$ as a function of time;

FIG. 6A shows the raised cosine windows;

FIG. 6B shows the digital form of the cosine window for use on the narrow band filter input; and FIG. 6C shows the digital form of the cosine window for use on the wide band filter input.

DESCRIPTION OF THE PREFERRED EMBODIMENT

FIG. 1 shows the overall schematic of this invention. An analog to digital converter A has an input 24 for an analog signal and an output 26 for the digitized counterpart. The digitized counterpart is schematically processed in a short time span signal and a long time span signal for each of the discrete frequencies being detected.

High tone detector circuitry B includes parallel short time span filters 30 and long time span filters 32, each of which individually process the signal, and a detector 34. As previously indicated, the short time span filters 30 act as broad band pass filters which are only capable of integrating or summing the signal. Long time span filters 32 act as narrow band pass filters which are all capable of detecting the signal with a frequency resolution in the range of ±1.5 percent.

Low tone detector circuitry C is similar to high tone detector circuitry B. Specifically, broad band pass filters 40 all cause integration of the resulting signal. At the same time, the narrow band pass filters 42 pass each signal to a low group tone detector 44.

Each group tone detector consists of at least a portion of a microprocessor. In the case of high group tone detector 34, a conventional microprocessor such as a Z80 chip manufactured by the Zilog Corporation, Cupertino, Calif., receives each of the signals. The signals thereafter are integrated to determine their relative strength. Thereafter, the ratio of the signals are compared. If the signals of the discretely received signals from the narrow band pass filters 32 are of a ratio of 8/10 or greater with respect to the sum of the broad band pass filter signals 30, passing to the output decoder 50 occurs. Similarly, if the signal from narrow band pass filter 42 is of the proper ratio with respect to the broad band pass filter 40 passing up the signal from low group tone detector to the output decoder occurs. With passage of a signal from each of the received group tone detectors 34, 44, an output from the filter network occurs.

Referring to the analog to digital converter A, a one bit converter is particularly simple to construct (it is just a comparator), and eliminates the questions of scale factor and possible gain adjustment. The output will be a logical "1" if the received input is positive, and a logical "0" if the received input is negative. For present purposes, the negative response will be taken as −1. If a single frequency sine wave is put into such a circuit, the output will be a square wave of that frequency. If the base to peak amplitudes in both input and output are 1, the power spectra are as shown in FIG. 3 (Unit amplitude sine wave is 0 dB).

When two frequencies that are not harmonically related are used as the input, the output spectra will depend on the relative amplitudes of the two components. Since the DTMF frequencies were chosen to cover less than a span of 3:1, the third and higher harmonics lie outside the frequency band of interest. The amplitude of the output at either input frequency as a function of the ratio of the amplitude (twist) is as shown in FIG. 4. FIG. 4 demonstrates the well-known "capture" effect, in that the larger signal dominates the smaller signal.

In FIG. 4, the amplitude of signal $F_1$ with respect to $F_2$ is plotted as a ratio along the abscissa. The abscissa or vertical axis includes the output with the amplitude of $F_1$ compared to the amplitude of $F_1$ without the signal $F_2$ being present. As is plainly seen, this curve flattens beyond the point 60. That is to say, where the amplitude of $F_1$ exceeds the amplitude of $F_2$ by a factor of 4, the amplitude of $F_1$ is the only dominant signal present. The remaining signal $F_2$ becomes indistinguishable and swallowed.

To circumvent this, advantage is taken of the prescribed ratio between the paired signals as has been previously set forth with respect to FIG. 2. Remembering the plot of FIG. 2, the ratio over which the inputs may vary in DTMF Type I receivers ($Af_H/Af_L$) shall be between +4 dB and −8 dB. The range of output signals for this range of input signals is about 16 dB.

Since the receiver must respond to frequencies that are within 1.5% of nominal, and not respond to those that are further away than 3.5% of nominal, and furthermore must determine the response within 40 milliseconds, a serious problem arises in the filter design. However, if the decision threshold is made adaptable, to accommodate the 16 dB range of input level to the filter, the design is greatly simplified.

The solution is to implement 16 digital filters, 2 for each of the 4 low frequencies and 2 for each of the 4 high frequencies. For each frequency one of the digital filters is a narrow band filter and one is a wide band filter. If the output of each of the narrow band filters is the power at the nominal frequency over M cycles, and the output of each of the wide band filters is the power at the nominal frequency over M/2 cycles, eight normalized outputs can be calculated.

$$\theta_i = \frac{F_{in}}{F_{1w} + F_{2w} + F_{3w} + F_{4w}}$$

where i=1, 2, 3, 4 index the frequencies in the "low" group.

$$\theta_i = \frac{F_{in}}{F_{5w} + F_{6w} + F_{7w} + F_{8w}}$$

where i=5, 6, 7, 8 index the frequencies in the high group.

Subscripts denote frequency and "n" stands for narrow, "w" for wide. $F_i$ is the output power of the $i$th filter.

Now let us define a decision criterion $P_i$ whether a specific tone i ($1 \leq i \leq 8$) is present at the input: if the ratio $\theta_i$ is greater than a constant R, than we set $P_i=1$; otherwise we set $P_i=0$.

However, if there are two $\theta_i$ in the same group (low or high) with their outputs>R, we do not set either $P_i$ to 1. The decision is based on the requirement that only one frequency be present in the low group and only one frequency be present in the high group.

For present purposes, a value R=0.8 has been found to separate false hits from true hits in virtually all cases.

The value 14 cycles and 7 cycles (for narrow and wide band sampling) were chosen for M and M/2 because 14 cycles is sufficient for a 3.5% frequency deviation to spill over into adjacent frequency bands and implement the desired bandpass filter. On the other hand, 14 cycles at 697 Hz (the lowest frequency) is almost 20 ms in duration, allowing valid tone intervals to be bracketed by two successive 20 ms periods, and still satisfy the ±1.5% frequency resolution requirement.

The full decision criteria are these: If one and only one low frequency output $P_i=1$ for two consecutive fourteen cycle periods, and if during the same periods one and only one high frequency output $F_j=1$, then we have detected a tone pair.

FIGS. 5A-5C are useful in understanding how we determine how much power is in each frequency range of interest. It is well known to those familiar with the signaling art that a method of determining how much power is in a signal at (and near) some frequency f is to convolve the signal with a sine wave of the frequency f. As can be seen from FIGS. 5A and 5B, these signals may have an arbitrary phase between them. The power is independent of the arbitrary phase angle of the detection signal. In order to obtain a truly relevant physical quantity (i.e. the power), we convolve the suspect signal with a sine wave and, separately and simultaneously, with a cosine wave. We square the separate convolution results and add them. Since one convolution depended on the arbitrary phase $\phi$ like $\cos \phi$ and the other convolution like $\sin \phi$, by squaring, summing and using the trigonometric identity $\sin^2 \phi + \cos^2 \phi = 1$ we see that the result is independent of the arbitrary phase angle $\phi$.

A convolution involves multiplying the suspect signal by the sine or the cosine and integrating that product over some length of time. Multiplication, however, is more expensive than addition. We have found a way to obtain the same convolution results by only adding and subtracting.

Our method involves the use of square waves instead of sine and cosine waves. FIG. 3 showed that a square wave has a fundamental frequency component, as well as third, five harmonics, and so on. The DTMF system is set up so that the third harmonic of the lowest frequency (697) is higher than the highest frequency (1633). Because this spurious signal is outside of the range of interest, a square wave of the same frequency as the fundamental frequency may be used to obtain completely satisfactory results.

It should be noted that this method works with any function which is the same frequency as the fundamental and has certain symmetry properties. The symmetry requirements are that the signal be symmetrical about the start, quarter, half and three quarters point in the cycle. This can best be shown by specific examples. The first cycle of the square wave in FIG. 5B has such symmetry. Starting from the vertical line with the +1 to the right, the wave is symmetric about the start (odd), about the quarter cycle point (even), about the half cycle point (odd) and about the three quarter cycle point (even). The same in true of a sine wave or a triangular wave. The square wave will work for an arbitrary number of sample points per cycle. For simplicity the explanation will be done with square waves and four sample points per cycle.

FIG. 5A shows a suspect signal which has been digitized. FIGS. 5B and 5C show a "sine" and a "cosine" wave respectively, both having the same frequency, phase and amplitude. In each of the waveforms of FIGS. 5A–5C, sample points are indicated. These sample points are labeled respectively A, B, C, D and then repeated A', B', C', D', A'', etc.

Assume now that the suspect wave, FIG. 5A, has the value a at A, b at B, c at C and d at D. It will be noted from FIG. 5B that the sign of the sine wave has value +1 at A, +1 at B, −1 at C and −1 at D. Thus if we multiply the suspect signal point by point by the sign of the sine wave we get +a at A, +b at B, −c at C and −d at D. Thus if we sum these we get (a+b−c−d) for the first cycle. This sum is repeated for a predetermined number of cycles.

We do the same for the sign of the cosine at the same time. It will be noted from FIG. 5C that the sign of the cosine wave has the value +1 at A, −1 at B, −1 at C and +1 at D. Thus if we multiply the suspect signal point by point by the sign of the cosine wave we get +a at A, −b at B, −c at C and +d at D. If we sum these we get (a−b−c+d) for the first cycle. This sum is repeated for a predetermined number of cycles.

It will be noted that all the necessary convolution information is contained in the numbers a−c and b−d. That is, the sine convolution is (a−c)+(b−d) and the cosine convolution is (a−c)−(b−d). By exploiting this fact we can cut down the number of computation steps by a factor of two.

Suppose the convolution function (e.g. the sign of sin ($2\pi f_i t$)) is divided up into four even quarters in time as has been done in the drawings of FIG. 5. Assume a uniform sampling rate of the suspect signal. Any values measured during the observation period will be accumulated in one of two accumulators, there being two for each discrete frequency, e.g. a total of 16 accumulators for the 8 touch tone frequencies. Any values of the suspect signal that are sampled during the first quarter of the convolution function cycle (e.g. section A on FIG. 5) are added to the first accumulator. Any values sampled during the second quarter of the cycle (e.g. section B on FIG. 5) are added to the second accumulator. Any values samples during the third quarter of the cycle (e.g. section C on FIG. 5) are subtracted from the first accumulator. Any values sampled during the fourth quarter of the cycle (e.g. section D on FIG. 5) are subtracted from the second accumulator. It will be noted that any sampled value is accumulated in only one of the two accumulators.

As mentioned before our method uses the convolution of the suspect signal with the "sine" and "cosine" functions. In the following description, "sine" and "cosine" means sign of sine and sign of cosine. By summing the square of each of these convolutions the power calculated is independent of the phase angle between the suspect signal and the convoluting sine and cosine. These "sine" and "cosine" convolutions are obtained from the information in the accumulators as follows. Accumulator 1 contains (a−c). Accumulator 2 contains (b−d). The "sine" convolution is the sum of the contents of Accumulator 1 and Accumulator 2. The "cosine" convolution is the difference of the contents of accumulator 1 and accumulator 2. The sum of the square of these two convolutions are then added. That is, the sum of the squares of the "sine" and "cosine" convolutions is equal to:

$$[(a-c)+(b-d)]^2+[(a-c)-(b-d)]^2$$

However, this is readily shown to be equal to:

$$2[(a-c)^2+(b-d)^2]$$

Thus it is unnecessary to add or subtract the contents of the accumulators before squaring. Once the sums (a−c) and (b−d) have been accumulated in their respective accumulators we square the contents of each of the accumulators and add them together. The number thus obtained is a direct representation of the value of the power that was in the suspect signal at and around the convoluting functions frequency.

This method of frequency detection involves comparing the power through a narrow band filter centered on the frequency (e.g. one of the Touch Tone® frequencies) to the power in that group of frequencies (e.g. the "high" or "low" group). This method can be done with or without physically separate filters. Without physically separate filters the narrowness of the filter is inversely proportional to the length of time over which the suspect signal is sampled. An infinitesimal sampling time gives complete uncertainty as to frequency, i.e. an infinitely broad filter. An infinitely long sampling time gives complete certainty as to frequency, i.e. an extremely narrow filter.

When our receiver is used with a DTMF Touch Tone system, sampling for seven cycles provides an adequate wide band filter. Sampling for fourteen cycles provides an adequate narrow band filter. The following procedure is used for each of the frequencies to be detected (eight in Touch Tone®). The suspect signal is sampled a predetermined number of times per cycle for seven cycles. The value of the suspect signal is accumulated in the accumulators as per the previous instructions. The values in the accumulators are stored after seven cycles, the accumulators cleared and seven more cycles are accumulated. To get the power through the narrow band filter we merely add the value in the accumulator of the last seven cycles to the stored value from the first seven cycles and square that sum. Comparison is then made between the power through the narrow band to the power through all of the wide band filter outputs in that frequency group. If this ratio is greater than a certain number (0.8 in our system), then a tone has been detected.

Regarding gaussian noise the specifications for Type I Receivers include correct recognition in the presence of gaussian noise with the signal frequencies at the nominal frequencies and of equal amplitude with 0 to 3 KHz white noise 15 dB below each signal.

When three frequencies are input to the comparator, two of equal amplitude and the third 15 dB below the others, the output of the comparator at the third frequency is 15 dB below the output of the other two. Since the noise is distributed over the entire 0 to 3 KHz band, it does not cause any significant error rate.

The impulse noise test specifications indicate the peak value of the impulse is 0.200 volts. If this was a single frequency sine wave of this amplitude, its level would be −29.5 dBm, or 9.5 dB below the amplitude of each of the signals in the test. Impulse noise of this amplitude should not result in any significant error rate.

Regarding dial tones, a problem is presented. The receiver is also required to operate in the presence of dial tones of 350 Hz and 440 Hz. The third harmonic of 440 Hz lies in the allowable band of 1336 Hz±1.5%, and is a potential problem. However, 350 Hz and 440 Hz are present simultaneously, and the third harmonics out of the comparator are about 20 dB below the fundamental amplitudes, instead of 10 dB, the case when only one frequency is present. There is also a heterodyne effect, producing some component of the frequencies 350 Hz+440 Hz+$f_s$ and 350 Hz+440 Hz−$f_s$. There are some signal frequencies $f_s$ where this heterodyned frequency falls in the allowable band for another signal frequency. The effect is worse when the 350 Hz and 440 Hz have the same amplitude. The maximum ratio of each of these amplitudes to the signal amplitude is 12 dB. When the ratio is this great, the ratio of original frequency signal to heterodyned signal out of the comparator is only 5 dB. This is not a sufficient margin for reliable operation. Attenuating the dial tone amplitude with one or more high pass filters with a pole at 1000 Hz does not provide reliable detection in the presence of maximum allowable twist. The implications of this failure are discussed below.

As stated above, the one-bit approach fails to capture DTMF tones in the presence of dial tone. In particular, if the dial tones are present with relative amplitude 5.6 (the maximum allowed), and the low and high frequencies have respective amplitudes 1 and 1.6, the lower frequency is often masked by the dial tones. On the other hand, the above one-bit approach is perfectly adequate if it is known in advance that no dial tone of amplitude greater than that of either DTMF frequency is present.

To solve the general problem of Type I receivers, we need an A-to-D converter whose dynamic range covers the range of input signals specified. We employ one additional technique to suppress dial tones. The one-bit method above is equivalent to using a rectangular window M cycles wide to examine the incoming signals. Such an approach has (sin x)/x spectral response characteristics about each center frequency. In order to attenuate the amplitude of spurious responses at the lobes of the window, we employ instead of a rectangular window, a raised cosine window. In other words, where the window covers M cycles we multiply the input signal I(t) by [cos (2π$f_i$t/M+π)+1] before integrating. The effect is to damp out the power at the edges of the window, which disproportionally reduces the spurious frequencies.

Using the shaped window approach, we employ an M cycle window for each frequency to capture narrow band power, and the middle M/2 cycles to capture wide-band power.

Again, let I(t) be the input signal, sampled L times per cycle for each frequency. Let $$H_{iN}(t) = \cos(2\pi f_i t/M + \pi) + 1$$

be the narrow-band shaping coefficient, and let $$H_{iW}(t) = \cos\left(2\pi f_i t/\left(\frac{M}{2}\right) + \pi\right) + 1$$

be the wide-band shaping coefficient. Then as before we define $$S_{iN} = \sum_{L \cdot M} I(t) \sin(2\pi f_i t) H_{iN}(t)$$

and $$C_{iN} = \sum_{L \cdot M} I(t) \cos(2\pi f_i t) H_{iN}(t)$$

as narrow band filters, and $$S_{iW} = \sum_{L \cdot \frac{M}{2}} I(t) \sin(2\pi f_i t) H_{iW}(t)$$

and $$C_{iW} = \sum_{L \cdot \frac{M}{2}} I(t) \cos(2\pi f_i t) H_{iW}(t)$$

as wide-band filters. The decision ratios $\theta_i$ are defined as above. It must be mentioned that these ratios are in theory four times their previous values because the wide band filters cover only half as many cycles.

To implement the n-bit method, we employ a synchronous detector as above. In place of a fully-resolved raised cosine, we employ a four level step function. In place of sin (2π$f_i$t) and cos (2π$f_i$t) we employ a single table of L values, each of which is an integer from −4 to 4. The number 4 was chosen because using a larger integer and hence greater resolution did not significantly improve the results.

In order to bracket tones which do not precisely coincide with the sampling window, we run two windows simultaneously, exactly one-half window out of phase. The use of the discrete shaping function makes this particularly convenient.

As to the values of the parameters n (number of bits of A-to-D conversion), and L (number of samples per cycle), we must await further performance specifications. We have tried n=4 and 8, along with L=4 and 8. (We used M=32 cycles in all cases). One can select values of n and L to achieve a specific performance level. Of course, the selection will affect hardware costs.

The A-to-D converter must be capable of 3000 L conversions per second.

For each frequency i, the calculations of $S_{iN}$ and $C_{iN}$ require between them L·M·2 multiplications per sampling window, exclusive of shaping. In fact, each multiplication is of a digitized value I(t) by a small integer and could be best done by repeated addition. This yields an average of L·M·2·2 additions per sampling window.

Now FIGS. 6B and 6C are graphs of suitable sampling windows, showing shaping coefficient versus a time index j. This works best if M is chosen to be a multiple of 16 (e.g. M=32 cycles per window). The shaping function H has been distorted so that it occupies equal-spaced steps for equal periods of time.

Each value of j then covers an integral number of cycles, and also is covered by a single value of H, both for the wide band and the narrow band filters. Therefore, if we accumulate the sums $\Sigma I(t) \sin (2\pi f_i t)$ and $\Sigma I(t) \cos (2\pi f_i t)$, we need only multiply by H(t) at even integral values of j to form $S_{iN}$ and $C_{iN}$, and at middle integral values of j to form $S_{iW}$ and $C_{iW}$. Again invoking the principle of repeated addition, the shaping adds $2(2\cdot 8 + 1\cdot 8 + 2\cdot 8 + 1\cdot 8) = 96$ additions per sampling window. Running two windows out of phase with each other adds another 96 additions per window.

To summarize, the calculations of $S_{iN}$, $C_{iN}$, $S_{iW}$, and $C_{iW}$ requires $4L\cdot M + 192$ additions per sample period. For $L=8$ and $M=32$, this yield 1216 additions per 45 milliseconds per frequency, or 216177 additions per second. (M is clearly irrelevant to this calculation).

The memory needs are as follows: for each frequency i, 2 accumulators to hold $\Sigma I(t) \sin (2\pi f_i t)$ and $\Sigma I(t) \cos (2\pi f_i t)$, 4 accumulators to hold $S_{iN}$, $C_{iN}$, $S_{iW}$, and $C_{iW}$, plus 4 more to hold the off-phase filters. This totals 80 accumulators, typically 16 bits wide each.

Referring again to FIG. 1, particularization of the timing and control can be seen. Typically an 8 MHz clock 100 connects to nine dividers 101 through 109. Remembering that the clock is driven at a 8 MHz rate, the integer value of the dividers may be computed as digital signals that are released from the A to D converter, A. It will be noted that the clocks rates which come from the system clock 100 drive the Z-80 chip manufactured by the Zilog Corporation of Cupertino, Calif.

The short time span filters 30, 40 and the long time span filters 32, 42 are dividers such as the divider 7497 sold by the Texas Instruments Co. of Dallas, Tex. The analog to digital converter A can be a National Semiconductor ADC 0801 manufactured by the National Semiconductor Corp. of Santa Clara, Calif.

Those skilled in the art will appreciate that the dividers have to each be programmed with an integer division to be made. The integer division value is given for each of the frequencies in FIG. 1. A sample calculation as to how these values are determined can be discussed.

Division may be made for the remainder of the circuitry disclosed. For example, and considering the 941 hz output, a division value of 1,063 an integer is determined with an optimum frequency of 940.73 being the actual frequency examined. Since this is well within the system tolerances, the integer value here selected is more than satisfactory. The remaining divider rates appear in the drawing.

It will thus be seen that each of the filter bands is in effect gated in step with the digital frequency desired. Utilizing the one bit multiplication here disclosed, each of the bits in effect are accumulated to the desired accumulators, summed and compared in the ratio heretofore described and examined by comparison for threshold outputs of their signals.

Summation of the cosine window signals herein disclosed is similar. In the case of the sine and cosine functions of the cosine windows, the bits are simultaneously switched to separate accumulators, within the Zilog chips. Thus, for each discrete frequency there are two filters to hold the sine and cosine function, four accumulators to hold the window function and four more to hold the off-phase filters. Given ten filters for each discrete frequency and eight separate frequencies this totals 80 accumulators, the disclosed timing and control being sufficient for the switching throughout the entire system.

Continuing on with the disclosure, a sample computer program written in Basic Language is included herewith.

```
1000 DEF FNQ(S)

1020 IF S>0 THEN RETURN (INT(M5×S)+1)/M4 ELSE
     RETURN INT(M5×S)/M4

1040 FNEND

1060 K9=8

1080 DEF FNT(X)

1100 IF ABS(X)<.001 THEN RETURN 0 ELSE RETURN
     SGN(X)

1120 FNEND

1140 DIM X(10),Y(10) \REM X=NUMERATOR,Y=INDEX

1160 F0$="DATA39,2"

1180 DIM S1(10),C1(10),S2(10),C2(10),U6(10)

1200 REM S1 HOLDS SUM SIN×SIN

1220 REM C1 HOLDS SUM COS×SIN

1240 REM S2 HOLDS FORMER SUM S×S

1260 REM C2 HOLDS FORMER SUM C×S

1280 REM U6 COUNTS OUT 8×N CYCLES

1300 DEF FNC(F)

1320 IF F1=0 THEN RETURN 1/SQRT(1+(P5 /F)∧2) ELSE
     RETURN 1

1340 FNEND

1360 IF FILE (F0$)> 0 THEN DESTROY F0$ \REM
     DELETE THE OLD FILE IF THERE IS ONE

1380 CREATE F0$,3 \REM 22 BLOCKS NEEDED FOR 48
     CASES

1400 OPEN # 1,F0$

1420 DIM H1$(80),H2$(80),H3$(80),H4$(80)

1440 H1$="TEST 37 10/4/79 SYNCHONOUS TEST WITH
     VARIOUS PROBLEMS"

PRESS RETURN TO CONTINUE

1460 H2$="A COUNTER AT 233554 HZ GETS DIVIDED TO
     MAKE S8 FREQS. AT EVERY HIT"

1480 H3$="A 233554 COUNTER GETS DIVIDED BY S8,
     AND PARTAILS EVERY L5 CYCLES"

1500 H4$="VARIABLES PRINTED ARE F7,F8,N0,C0,A0
     (SLOP FREQ)"

1520 WRITE #1,H1$,H2$,H3$,H4$

1540 DIM A(10),F(10),S(10),C(10),P0(10),T0(10),N8(100)

1560 OPEN #2,"GAUSSNS,2"

1580 FOR I=1 TO 100 \READ#2,N8(I) \NEXT I \REM
     READ GAUSSIAN NOISE
```

1600 CLOSE #2

1620 REM A=ANS,F=FREQ,S,C=SIN,COS,P0,TO ACCUM TIMES

1640 F(0)=1067 \REM FREQ IN MIDDLE OF BAND

1660 F(1)=697 \F(2)=770 \F(3)=0852 \F(4)=0941 \REM LOWER FREQUENCIES

1680 F(5)=1209 \F(6)=1336 \F(7)=1477 \F(8)=1633 \REM HIGHER FREQUENCIES

1700 F(9)=350 \F(10)=440 \REM DIAL TONE FREQS

1720 M1=−1 \P=3.1415926 \REM CONSTANTS

1740 DIM U(10),U1(10),U2(16),U3(16),U4(10)

1760 DIM V6(500) \REM MAXIMUM SIZE =S8×L5

1780 DIM S3(10),C3(10) \REM HOLDS NARROW BAND STUFF IN THE MIDDLE

1800 REM U2 HOLDS SINE MULT SEQ (++++−−−−), U3 HOLDS COS(++−−−−++)

1820 REM U4 POINTS TO U2 AND U3

1840 FOR K7=1 TO 4 STEP 3

1860 FOR K8=8 TO 5 STEP −3

1880 FOR N0=0 TO 0 \REM NOISE LEVEL

1900 FOR W=1.6 TO 1.6 STEP 1.0 \REM POSSIBLE TWISTS

PRESS RETURN TO CONTINUE

1920 FOR A0=0.0 TO 5.6 STEP 5.6 \REM POSSIBLE DT AMPS

1940 FOR F1=1 TO 1 STEP −1 \REM IF 0 THEN UNFILTERED WLSE FILTERED

1960 FOR P5=1000 TO 1000 STEP 1000

1980 FOR C0 = .035 TO .015 STEP−.02 \REM POSSIBLE SLOPS

2000 FOR C2=1 TO 1 \REM APPLY SLOP TO LOWER THEN HIGHER

2020 C3=1−C2 \REM IF C2=0 THEN NO LOWER SLOP

2030 C3=1

2040 F7−F(K7)×(1+C0×C2)+0\F8=F(K8)×(1−C0×C3)−0 \REM ACTUAL FREQUENCIES TIME

2060 M7=FNC(F7) \M8=FNC(F8) \REM ATTENUATED AMPS

2080 FOR T5=.193 TO .193 \REM TOTAL TIME

2100 FOR L5=30TO40 STEP10 \REM # CYCLES

2120 FOR S8= 4TO 4 STEP 4 \REM # SAMPLES PER CYCLE

2140 V2=L5×S8 \REM # POINTS TO KT DOWN

2160 FOR I=1 TO V2 \V6(I)=INT(2× (COS((I×2×P)/V2+ P)+1)) \REM MULT BY COS FCN

2170 NEXT I

2180 V3=V2×.25 \V4=V2×.75

2200 M6=FNC(435) \M9=FNC(435)

2220 FOR M3=4 TO 4 STEP 4 \REM # A-2-D PLACES

2240 M4-2∧(M3−1) \REM MAXIMUM VALUE IN ONE POLE

2260 M2=A0×(M6+M9)+M7+M8×W

2280 M5=M4/M2 \REM PARTS OF RANGE

2300 FOR S9=1 TO S8 \X=2×P×S9/S8 \REM GENERATE SIN PATTERNS

2320 U2(S9)=SGN(SIN(X)) \U3(S9)=SGN(COS(X)) \NEXT S9

PRESS RETURN TO CONTINUE

2340 S0=2335549×S8 \REM SAMPLING FREQUENCY, HERTZ

2360 S1=1/S0 \REM SAMPLING PERIOD, SECONDS

2380 FOR K=1 TO K9 \U(K)=INT(S0/(F(K)XS8)+.5) \REM KTS TO FREQ×8

2400 U1(K)=U(K) \NEXT K

2420 N=T5/S1 \REM # POINTS

2440 D=2×P×S1 \REM 2 PI DELTA T

2460 D7=D×F7 \D8=D×F8 \REM 2 PI DT FREQ

2480 D6=D×345 \D9=D×435 \REM 2 PI DIALTONE

2500 FOR K=1 TO K9 \REM INITIALIZE COUNTERS

2520 A(K)=0 \S(K)=0 \C(K)=0 \TO(K)=0 \S1(K)=0 \ S3(K)=0 \C(K)=0

2540 P0(K)=F(K)×D \REM 2 × PI × DT × FREQ

2560 NEXT K

2580 ! \! \! \FOR R=1 TO 16 \! "xxxx", \NEXT R \! \! \!

2600 IF F1=1 THEN !" UNFILTERED" ELSE !" FILTERED"

-continued

2620 !" ",M3," BIT A-TO-D"

2640 !" SHAPED RAISED COSINE WINDOW, 4 DESCRETE STEPS"

2660 T7=0 \T8=0 \REM RUNNING SUMS OF D7,D8

2680 T6=0 \T9=0 \REM DIAL TONE T

2700 R1=0 \R2=0 \R3=0 \R4=0 \N2=RND(−1) \REM WINDOW FILTER

2720 !"L5=",L5," S8=",S8," F7=",%6F0,F7," F8=",F8,

2740 !" C0=",C0," N0=",N0," A0=",A0," W=",W," P5=",P5

2760 REM MAIN LOOP FOLLOWS. FOR EACH TIME T \

2780 REM "DIGITIZE" (COMPUTE V2= SGN (SIN (2 PI F7 DT) + W × SIN (2 PI F8 DT))

PRESS RETURN TO CONTINUE

2800 REM S(K)= SUM (V2×SIN(F(K)×2 PI DT))

2820 REM C(K)= SUM V2 × COS F(K) × 2 PI DT)

2840 REM START OF MAIN LOOP

2860 FOR K=1 TO K9 \IF K=K7 THEN !%7F0,F7, \IF K=K8 THEN !%7F0,F8,

2880 IF K<>K7 AND K<>K8 THEN !" ", \NEXT K \!

2900 FOR K=1 TO K9 \!%F0,F(K), \NEXT K \!

2920 I=0

2940 Q=1 \REM INITIALIZE FLIP/FLOP

2960 FOR K=1 TO K9 \U6(K)=L5×S8 \U4(K)=0 \NEXT K \REM INIT # PTS PER CHAN

2980 FOR Z=1 TO S0 \REM DUMMY LOOP

3000 U8=1 \REM FIND MINIMUM KT LEFT

3020 FOR K=1 TO K9 \IF U1(K)<U1(U8) THEN U8=K \ NEXT K

3040 U7=U1(U8) \REM LESST # LEFT

3060 I=I+U7

3080 N1=RND(0)×100.+1

3100 R1=R2 \R2=R3 \R3=R4 \R4=N8(NI) \N2=(R1+R2+R3+R4)×.25

3120 FOR K=1 TO K9 \U1(K)=U1(K)−U7 \NEXT K

3140 K=U8 \U1(K)=U(K) \U6(K)=U6(K)−1 \REM ONE FEWER POINT TO DO

3160 U5=U4(K)+1 \IF U5>S8 THEN U5=1 \U4(K)=U5

3180 V1=M7×SIN(D7×I)+M8×SIN(D8×I)×W+N2×N0× 3.5/4

3200 IF A0<>0 THEN V1=V1+A0×(M6×SIN(D6×I)+M9× SIN(D9×I))

3220 V1=FNQ(V1) \V5=U6(K)+1 \V2=V1×V6(V5)

3240 C(K)=C(K)+V2×U3(U5)

PRESS RETURN TO CONTINUE

3260 S(K)=S(K)+V2×U2(U5)

3270 IF V5>= V3 AND V5<= V4 THENV2=V1×V6((V5−V3)×2+1)

3280 IF V5>=V3 AND V5=V4 THEN S3(K)=S3(K)+V2× V2(U5)

3320 IF V5>=V3 AND V5=V4 THEN C3(K)=C3(K)+V2× U3(U5)

3340 IF K=1 AND U6(K)=0 THEN GOSUB 3760

3360 IF U6(K)=0 THEN GOSUB 4300 \REM START AGAIN

3380 IF I>N THEN EXIT 3440

3400 IF Q=3 THEN EXIT 3440 \IF Q=2 AND L5=40 THEN EXIT 3440

3420 NEXT Z

3440 REM

3460 NEXT M3

3480 NEXT S8

3500 NEXT L5

3520 NEXT T5

3540 NEXT C2

3560 NEXT C0

3580 NEXT P5

3600 NEXT F1

3620 NEXT A0

3640 NEXT W

3660 NEXT N0

3680 NEXT K8

3700 NEXT K7

PRESS RETURN TO CONTINUE

3720 LOSE #1

3740 END

3760 GOSUB 4300 \Q=Q+1 \REMIF Q=2 THEN RETURN

3780 FOR K=1 TO K9

3800 !%4I,S1(K), \IF C1(K)>−99 THEN !%3I,C1(K), ELSE !%3I,−99, \NEXT K \!

-continued

```
3820 FOR K=1 TO K9 \!%4I,S2(K),

3840 IF C2(K)>-99 THEN !%3I,C2(K), ELSE !"xxx", \NEXT
     K \!

3860 DEF-FNS(K)=S1(K)∧2+01(K)∧2

3880 Q1=(0) \Q2=(0) \REM Q1 FOR LOW BAND, Q2 FOR
     HIGH BAND

3900 FOR K=1 TO 4

3920 Q1=Q1+FNS(K) \Q2=Q2+FNS(K+4) \REM LOAD
     UP SUMS OF SQUARES

3940 NEXT K

3960 FOR K=1 TO K9 \REM CALC NUMERATORS FOR
     ALL BANDS

2980 X(K)=( S2(K))∧2+( C2(K))∧2

4000 NEXT K

4020 FOR K=1 TO 4

4040 Y(K)=X(K)/Q1 \REM INDEX FOR LOWER

4060 !%7F3,Y(K),

4080 REM WRITE #1,Y(K)

4100 NEXT K

4120 FOR K=5 TO 8 \REM HIGHER BAND

4140 Y(K)=X(K)/Q2

4160 !%7F3,Y(K),

PRESS RETURN TO CONTINUE

4180 REM WRITE #1,Y(K)

4200 NEXT K

4220 IF K9=10 THEN !%7F3,X(9)/Q1,X(10)/Q1

4240 ! \!

4260 K=1

4280 RETURN

4300 S1(K)=INT(S3(K)) \C1(K)=INT(C3(K))

4320 S2(K)=INT(1 ×S(K)) \C2(K)=INT(1 ×C(K))

4340 REM!TAB((K-1)×7),%4I,S1(K),%3I,C1(K)

4360 S(K)=0 \C(K)=0

4380 S3(K)=0 \C3(K)=0

4400 U6(K)=L5×S8

4420 RETURN

READY
```

Referring to lines 3780 and 4420 the filter is emulated in computer language.

The reader will appreciate that this language can be directly converted to operate the disclosed Zilog 80 chip. The reader is referred to the *Z-80 Microcomputer Handbook* by William Barden, Jr. published by Howard W. Sams & Co., Inc. of Indianapolis, Ind. (©1978). Referring to this work at Section II entitled "Z-80 Software" and with special attention to Chapter 9 the reader or anyone having skill in the art can take the discrete disclosed steps in the accompanying program and convert it to actual language utilized within the Zilog 80 chip.

It will be appreciated that in accordance with the disclosed timing, interrupt functions will have to be provided to the Zilog 80 hardware. For such interrupt functions, specific reference is made to the *Z-80 Microcomputer Handbook* at Chapter 15. Additionally, Chapter 12 will disclose multiplication and division requirements present in the co-sign window.

Other portions of the disclosed sample computer can be easily understood. An amplitude generator is present at lines 1640 to 2030. Sinewave functions for the generation of the discrete frequencies are in the vicinity of lines 2840 to 3240. Various parameters are tested in the filters in the vicinity of lines 2040 through 2320. A dial tone simulation is present in the area of line 2480.

What is claimed is:

1. A method of determining the spectral composition of a suspect signal with respect to a group of frequencies, comprising the steps of:
   (a) passing said signal through a plurality of parallel narrow band filters, each said narrow band filter being centered on a respective one of said frequencies in said group;
   (b) passing said signal through a wide band filter spanning said group of frequencies; and
   (c) comparing the output of each of said narrow band filters to the output of said wide band filter and passing said signal only if the output of said narrow band filters exceeds a chosen ratio of the output of said wide band filter.

2. The method of claim 1 wherein said comparing step (c) comprises the step of dividing the output of each of said narrow band filters by the output of said wide band filter.

3. The method of claim 1 wherein at least one of said passing steps (a) and (b) comprises the step of passing said signal through a digital filter.

4. The method of claim 1 wherein said passing step (b) comprises the substeps of:
   passing said signal through a plurality of parallel intermediate band filters, each said intermediate band filter being centered on a respective one of said frequencies in said group;
   summing the outputs from said intermediate band filters.

5. The method of claim 1 wherein said passing step (a) comprises the substeps of:
   sampling said signal;
   convolving said signal with at least one convolution function for each frequency over a sufficient duration to provide said narrow band outputs.

6. A method of convolving a suspect signal with sine and cosine square waves of a given frequency comprising the steps of:
   sampling said suspect signal at uniform time intervals over at least one cycle of said given frequency;

adding the sampled value to the contents in a first accumulator containing the sign of said sine wave if and only if said sampled value is taken during the first quarter of said cycle;

adding the sampled value to the contents in a second accumulator containing the sign of said cosine wave if and only if said sampled value is taken during the second quarter of said cycle;

subtracting the sampled value from the contents in said first accumulator if and only if said sampled value is taken during the third quarter of said cycle;

subtracting the sampled value from the contents in said second accumulator if and only if said sampled value is taken during the fourth quarter of said cycle;

squaring the contents of said first accumulator after all sampling;

squaring the contents of said second accumulator after all sampling; and adding said squared accumulated values.

7. Apparatus for determining the spectral composition of a suspect signal having at least two suspect frequency components, each component being in a separate frequency group, comprising:

means for receiving said suspect signal in analog form;

means for converting said received suspect signal to a digital signal;

means for producing a further signal from said digital signal at each of the suspect frequencies;

first and second accumulators for each suspect frequency;

control means for adding or subtracting said further signal to said accumulators, said further signal being deposited into only one accumulator per sample point, the first accumulator having the value of the further signal added to or subtracted from said first accumulator only during any sample period in the first or third quarter cycle, respectively, at the suspect frequency, said second accumulator having the value of the further signal added to or substracted from said second accumulator only during any sample period in the second or fourth quarter cycle, respectively, at the suspect frequency;

means for storing the contents of said accumulators after a predetermined length of time;

means for numerically squaring the stored contents of said accumulators;

means for adding said squares into sums;

means for comparing said sums of squares for various suspect frequencies; and output means for said comparing means.

8. The apparatus of claim 7, and further comprising means for decoding said suspect signal by converting said sums of squares into representation indicating the frequency present.

9. The apparatus of claim 7, and further comprising means for shaping said suspect signal over the sampling period in order to suppress spurious signals.

* * * * *